United States Patent
Chen (10) Patent No.: US 9,680,423 B2
(45) Date of Patent: Jun. 13, 2017

(54) UNDER-SAMPLING DIGITAL PRE-DISTORTION ARCHITECTURE

(71) Applicant: Analog Devices Global, Hamilton (BM)

(72) Inventor: Dong Chen, Beijing (CN)

(73) Assignee: Analog Devices Global, Hamilton (BM)

( * ) Notice: Subject to any disclaimer, the term of this patent is extended or adjusted under 35 U.S.C. 154(b) by 1 day.

(21) Appl. No.: 13/798,561

(22) Filed: Mar. 13, 2013

(65) Prior Publication Data

US 2014/0266431 A1    Sep. 18, 2014

(51) Int. Cl.
| | |
|---|---|
| *H03F 1/26* | (2006.01) |
| *H03F 1/32* | (2006.01) |
| *H03F 3/189* | (2006.01) |
| *H03F 3/24* | (2006.01) |
| *H03M 1/06* | (2006.01) |
| *H03M 1/12* | (2006.01) |

(52) U.S. Cl.
CPC ......... *H03F 1/3247* (2013.01); *H03F 1/3258* (2013.01); *H03F 3/189* (2013.01); *H03F 3/245* (2013.01); *H03M 1/0614* (2013.01); *H03F 2201/3209* (2013.01); *H03F 2201/3224* (2013.01); *H03F 2201/3233* (2013.01); *H03M 1/1245* (2013.01)

(58) Field of Classification Search
CPC ..................................................... H03F 1/3241
USPC ................ 330/149; 375/296, 297; 455/114.3
See application file for complete search history.

(56) References Cited

U.S. PATENT DOCUMENTS

| | | | |
|---|---|---|---|
| 7,821,432 B2 | 10/2010 | Asami et al. | |
| 8,014,443 B2 * | 9/2011 | Nakamura et al. | ........... 375/232 |

(Continued)

FOREIGN PATENT DOCUMENTS

| | | |
|---|---|---|
| CN | 101656512 A | 2/2010 |
| CN | 104052413 A | 9/2014 |

(Continued)

OTHER PUBLICATIONS

Extended European Search Report and Search Opinion in counterpart European application No. 14157774.2, communication dated May 14, 2014.

(Continued)

*Primary Examiner* — Khanh V Nguyen
*Assistant Examiner* — Khiem Nguyen
(74) *Attorney, Agent, or Firm* — Schwegman Lundberg & Woessner, P.A.

(57) ABSTRACT

A amplifier system may include a predistorter receiving an input signal to generate a predistortion signal, a first converter receiving the predistortion signal to generate a preamplified signal, a power amplifier receiving the preamplified signal to generate an output signal based on the preamplified signal and the input signal, and a second converter sampling the output signal to generate a feedback signal. The power amplifier may produce a distortion signal at a first frequency, the second converter may sample the output signal using a timing signal with a second frequency that is lower than the first frequency to generate the feedback signal, and the predistorter, based upon the feedback signal, may predistort the predistortion signal to reduce the distortion signal at the first frequency.

20 Claims, 4 Drawing Sheets

(56) References Cited

U.S. PATENT DOCUMENTS

| | | | |
|---|---|---|---|
| 8,351,875 B2* | 1/2013 | Kato et al. | 455/114.2 |
| 2003/0156658 A1 | 8/2003 | Dartois | |
| 2008/0187035 A1 | 8/2008 | Nakamura et al. | |
| 2010/0159856 A1 | 6/2010 | Kato et al. | |
| 2010/0225390 A1* | 9/2010 | Brown et al. | 330/149 |
| 2012/0068768 A1 | 3/2012 | Ishikawa et al. | |

FOREIGN PATENT DOCUMENTS

| | | | |
|---|---|---|---|
| JP | 0486567 A | 3/1992 | |
| JP | 2000209295 A | 7/2000 | |
| JP | 2000209295 A | 7/2000 | |
| JP | 04086567 B2 | 5/2008 | |
| JP | 2009-159534 A | 7/2009 | |
| JP | 2011250459 A | 12/2011 | |
| JP | 2011250459 A | 12/2011 | |
| JP | 2012070063 A | 4/2012 | |
| JP | 2012070063 A | 4/2012 | |
| JP | 2013157750 A | 8/2013 | |
| KR | 10-2007-0031452 A | 3/2007 | |
| WO | 2005/112253 A1 | 11/2005 | |
| WO | WO-2005112253 A1 | 11/2005 | |
| WO | 2007046370 A1 | 4/2007 | |
| WO | WO-2007046370 A1 | 4/2007 | |

OTHER PUBLICATIONS

JP Office Action issued in JP Patent Appln. No. 2014-041322, dated Mar. 2, 2015, 9 pages (with English translation).

"Chinese Application Serial No. 201410092503.6, Office Action mailed Jun. 1, 2016", 9 pgs.

"European Application Serial No. 14157774.2, Extended European Search Report mailed May 14, 2014", 8 pgs.

"Japanese Application Serial No. 2014-041322, Examiners Decision of Final Refusal mailed Oct. 26, 2015".

"Japanese Application Serial No. 2014-041322, Office Action mailed Mar. 2, 2015", (With English Translation), 11 pgs.

"Korean Application Serial No. 10-2014-0027215, Office Action mailed Feb. 29, 2016", 6 pgs.

"Korean Application Serial No. 10-2014-0027215, Response filed Jun. 30, 2016 to Office Action mailed Feb. 29, 2016", with English translation of claims, 25 pgs.

"European Application Serial No. 14157774.2, Office Action mailed Dec. 21, 2016", 5 pgs.

"Japanese Application Serial No. 2014-041322, Office Action mailed Jan. 4, 2017", (w/ English Translation), 24 pgs.

"Korean Application Serial No. 10-2014-0027215, Notice mailed Nov. 21, 2016", (w/ English Translation), 2 pgs.

* cited by examiner

UNDER-SAMPLING DIGITAL PRE-DISTORTION ARCHITECTURE

BACKGROUND

Power amplifiers (PA) may be used in various applications, such as in broadcast equipment for wireless communication. The broadcast equipment may be contained in base transceiver station (BTS) or user equipment (UE) or other transceiver equipment used for wireless mobile communications, such as in LTE, WiMax, WiFi, CDMA, GSM, EDGE, and UMTS standards.

Power amplifiers ideally would produce output signals that are perfect linear amplifications of the input signals. However, when they are manufactured, power amplifiers often impart distortions upon their output signals due to non-ideal circuitry. In order to reduce such distortions in the output signals, additional circuit components are added to amplifier systems to compensate for nonlinear behavior in the power amplifier. Such additional circuits, however, often consume additional power. Additionally, as required bandwidth increases to support high speed communication applications, such compensation becomes increasingly difficult and expensive.

For example, a typical power amplifier in a BTS may represent a significant portion of the cost and power demand of the BTS, for example, 30% of total power demand and 30% of the cost. A typical power amplifier may have one or more zone of nonlinearity, and the nonlinear behavior of the typical power amplifier may be affected by various factors such as power supply, temperature, gain setting, etc. Nonlinearity in the power amplifier may degrade error vector magnitude (EVM), which is used to quantify the performance of a radio transmitter or receiver, and increase spectral regrowth, which is the spreading of signal bandwidth due to distortions.

The nonlinearity of a power amplifier may be dependent upon ambient factors. That is the nonlinearity is dependent upon the conditions of the power amplifier at the same moment when the power amplification occurs. Additionally, the nonlinearity of a power amplifier may be dependent upon memory effects of the power amplifier. That is the output signal of the power amplifier may contain nonlinear distortions generated in a previous point in time. Distortions due to memory effects of the power amplifier may be difficult to compensate.

Thus, there is a need for improved power amplifiers that compensates for nonlinearity efficiently with low power consumption.

DETAILED DESCRIPTION

According to an exemplary embodiment of the present disclosure, an amplifier system may include a predistorter receiving an input signal to generate a predistortion signal, a first converter receiving the predistortion signal to generate a preamplified signal, a power amplifier receiving the preamplified signal to generate an output signal based on the preamplified signal and the input signal, and a second converter sampling the output signal to generate a feedback signal. The power amplifier may produce a distortion signal at a first frequency. The second converter may sample the output signal using a timing signal with a second frequency that is lower than the first frequency to generate the feedback signal, and the predistorter, based upon the feedback signal, may predistort the predistortion signal to reduce the distortion signal at the first frequency.

Figure 1:
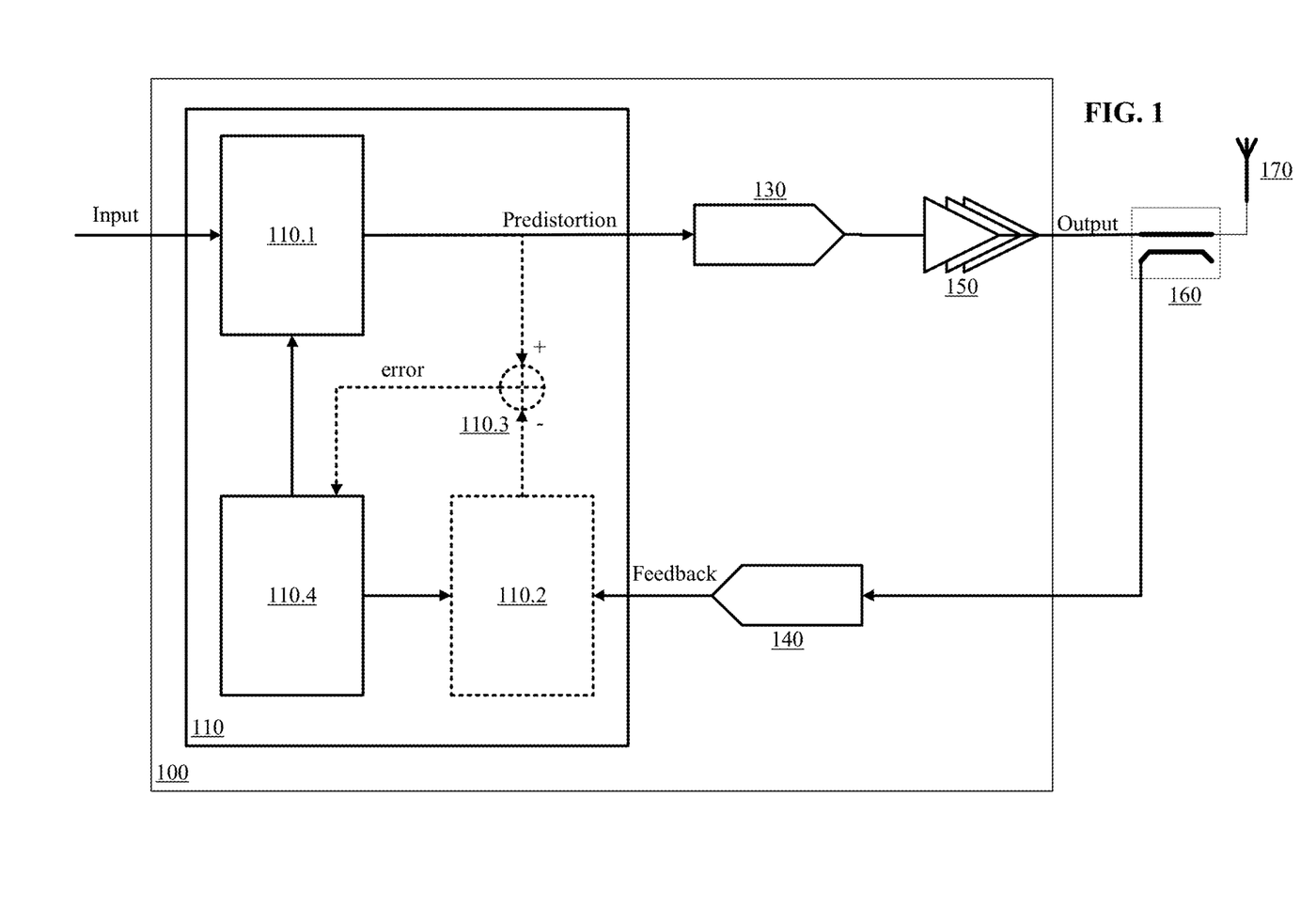
FIG. 1 illustrates a simplified block diagram of a amplifier system according to an embodiment of the present disclosure.

FIG. 1 illustrates an embodiment of the present disclosure. An amplifier system 100 may include a predistorer 110 receiving an input signal to generate a predistortion signal, a first converter 130 receiving the predistortion signal to generate a preamplified signal, a power amplifier 150 receiving the preamplified signal to generate an output signal based on the preamplified signal and the input signal, and a second converter 140 sampling the output signal to generate a feedback signal.

The output signal may be transmitted via an antenna 170. The second converter 140 may receive the output signal via a coupling 160. Between the first converter 130 and the power amplifier 150, there may be additional components, for example, modulators to convert the signal from Baseband/intermediate frequency (IF) to radio frequency (RF) in the transmission path. Between the second converter 130 and the coupling 160, there may be additional components, for example, modulators to convert the signal from RF to IF/Baseband in the receiving/feedback path. The additional components may include super-heterodyne or zero-IF transceivers.

The power amplifier 150 may have non-ideal circuit behavior. Its output may include a distortion component at a first frequency. The predistorter 110 may measure distortion components introduced by the power amplifier 150 and include predistortion components to an input signal to counteract the power amplifier's distortion. Specifically, the second converter 140 may sample the output signal via the coupler 160 at a second frequency that is lower than the first frequency to generate the feedback signal. The predistorter 110 may compare the output of the second converter 140 to local representations of the input signal to estimate the distortion signal and counteract it.

In an embodiment, the predistorter 110 may include a filter 110.1 and a controller 110.4. The filter 110.1 may introduce predistortion signal components to the input signal according to filter parameters that are provided by the controller 110.4. The controller 110.4 may receive the feedback signal from the second converter 140 directly, and control the filter 110.1 to predistort the predistortion signal to compensate for nonlinearity in the power amplifier 150.

The filter 110.1 may include a storage with a lookup table (LUT). The filter 110.1 may include a polynomial based filter, which may distort an input signal based on a polynomial equation of multiple orders that includes compensation for nonlinear distortions. A polynomial based filter may be capable of effectively compensating for the memory effects of a PA without significant additional modifications. A polynomial based filter for a predistorter used in communication applications may achieve sufficient compensation with a fifth order polynomial equation. However, other number of orders is possible.

In another embodiment, the predistorter 110 may include first and second filters 110.1 and 110.2, a subtractor 110.3 and a controller 110.4. The first filter 110.1 may introduce predistortion signal components to the input signal according to filter parameters that are provided by the controller 110.4. The second filter 110.2 may transform the feedback signal to generate a second predistortion signal. Then, the comparator 110.3 may compare the second predistortion signal to the predistortion signal from the filter 110.1 to produce an error signal, which may be received and used by the controller 110.4 to control and adjust the filter 110.1 and the second filter 110.2.

The first and second filters 110.1 and 110.2 may include storages with LUT's. The first and second filters 110.1 and 110.2 may include polynomial based filters, which may distort an input signal based on a polynomial equation of multiple orders that includes compensation for nonlinear distortions. A polynomial based filter may be capable of effectively compensating for the memory effects of a PA without significant additional modifications. A polynomial based filter for a predistorter used in communication applications may achieve sufficient compensation with a fifth order polynomial equation. However, other number of orders is possible.

The controller 110.4 may operate according to adaptive filter algorithms to adjust settings or parameters of the filter 110.1 and the second filter 110.2. Adaptive filter algorithms may include least mean square (LMS), least square (LS), recursive least square (RLS), linear quadratic estimation (LQE, Kalman Filter), or Bayesian estimation algorithm.

Additionally, the controller 110.4 may operate according to a learning algorithm that continually logs and monitors the feedback signal or the error signal (as well as other information, such as performance level of the PA and environmental conditions), to continually calibrate and improve the performance of the amplifier system 100. The controller 110.4 may include time-delay algorithm to compensate for the time delay of the feedback signal relative to the input signal.

The filter 110.1 and the second filter 110.2 each may perform a signal transform modeled according to a polynomial equation for nonlinearity, such as a truncated discrete time Volterra Series equation. The filter 110.1 and the second filter 110.2 may perform the same signal transform function, as controlled by the controller 110.4. The controller 110.4 may update and adjust the coefficients of the polynomial equation for nonlinearity.

According to an embodiment of the present disclosure, the first converter 130 may generate the preamplified signal based on the timing signal of the second converter 140. That is, the first converter's timing may be set based upon the sampling timing of the second converter 140, causing the first converter 130 and the second converter 140 to be time aligned to each other.

According to a feature of the present disclosure, the first converter 130 may include a digital-to-analog converter, or a plurality of digital-to-analog converters with a plurality of signal channels. The first converter 130 may be a sampled converter that generates an output voltage from a sampled input, then holds the output voltage for a period of output time until the next period of output time when a new output voltage is generated.

According to a feature of the present disclosure, the second converter 140 may include an analog-to-digital converter, or a plurality of analog-to-digital converters in parallel. The power amplifier 150 may produce a distortion signal at a first frequency, and the second converter 140 may sample the output signal using a timing signal with a second frequency that is lower than the first frequency to generate the feedback signal. That is, the second converter 140 may take samples of the output signal at a lower frequency than the frequency of the distortion signal generated in the output signal.

The nonlinearity of the power amplifier 150 may distort a linear input signal to produce multiple orders of distortion signals at frequencies at higher frequencies than the frequency of the linear input signal. To compensate for the distortion signals at the higher frequencies, samples of the output signal that includes the distortion signals are taken by the second converter 140. As the frequency of the input signals becomes higher along with advances in communication technology, the frequency of sampling in the second converter may become too high and may require too much power to be practical.

In practice, it is sufficient to compensate only distortion signals and, therefore, only distortion signals contain information useful for generating a preamplified signal to compensate for the nonlinearity of the PA. Thus, the second converter 140 only needs to sample enough of the output signal to obtain sufficient information about the distortion signals. Thus, the second converter 140 may under-sample the output signal to generate the feedback signal.

Figure 2A:
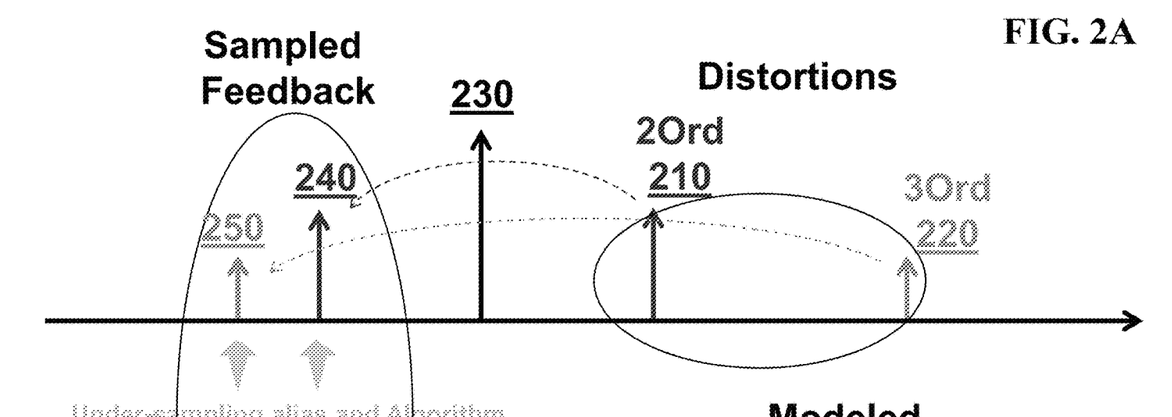
FIGS. 2A and 2B illustrate simulated frequency graphs of undersampling according to an embodiment of the present disclosure.
Figure 2B:
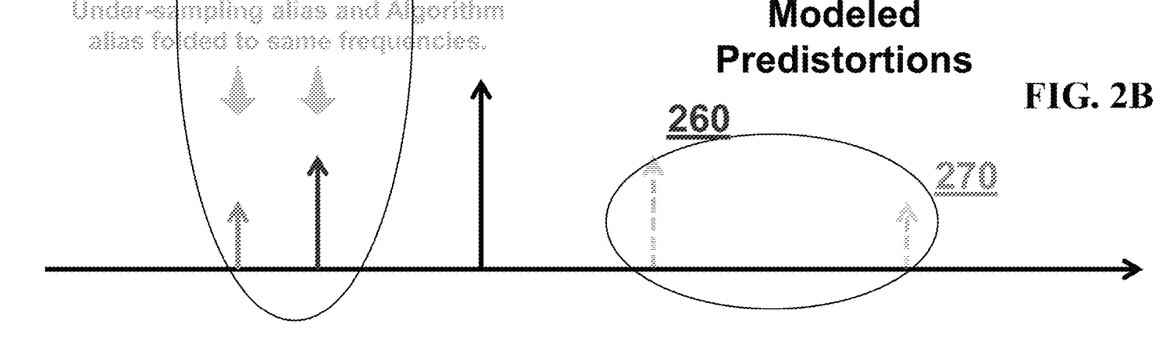

FIGS. 2A and 2B illustrate the effects of under-sampling for generating modeled predistortions consistent with embodiments of the present invention. FIG. 2A illustrates exemplary distortion signals 210, 220 in the output signal may be generated by a power amplifier at two frequencies, labeled as 2Ord and 3Ord. FIG. 2A also illustrates a sampling frequency 230 performed by a converter that may be lower than the frequencies of the distortion signals 210, 220. The resulting sampled signal may contain distortion components 240, 250 at lower frequencies due to frequency mirroring.

FIG. 2B illustrates that the sampled signals 240, 250 may be used to create modeled distortion signals 260, 270, which may be used for compensating the distortion signals. Once the sampled feedback is modeled, for example compensated as a negative feedback, in the predistorter 110, the first converter 130 may use the same sampling frequency or the same timing as the second converter 140 when generating the preamplified signal, for example by modulating the predistortion signal at the sampling frequency or timing. Thus, the resulting preamplified signal may be compensated for the modeled predistortions at the same frequencies as the distortion signals in the upper frequency graph.

According to another embodiment, the second frequency may be greater than a frequency of the predistortion signal. That is, the second frequency, i.e. the sampling frequency of the second converter 140, may be greater than the frequency of the predistortion signal.

Undersampling by the second converter 140 may be accomplished in several ways.

Figure 3A:
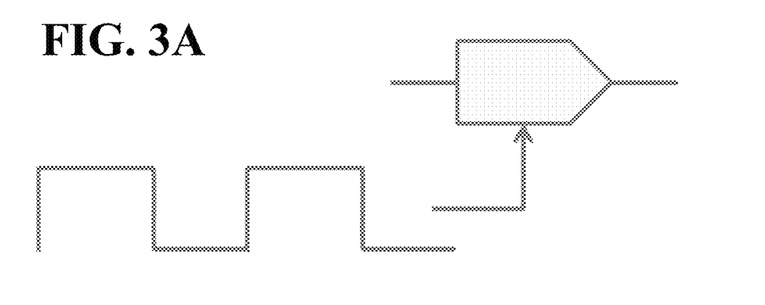
FIGS. 3A, 3B, and 3C illustrate exemplary undersampling signal sequences according to features of the present disclosure.

In a first embodiment, the second converter 140 may include an analog-to-digital converter that samples the output signal once within each sampling period of the second frequency. FIG. 3A illustrates an exemplary sampling signal that may be used for the second converter 140. In this case, a single analog-to-digital converter in the second converter 140 may sample the output signal once within each sampling period of the sampling signal, for example at the rising edges or the falling edges of the sampling signal.

Figure 3B:
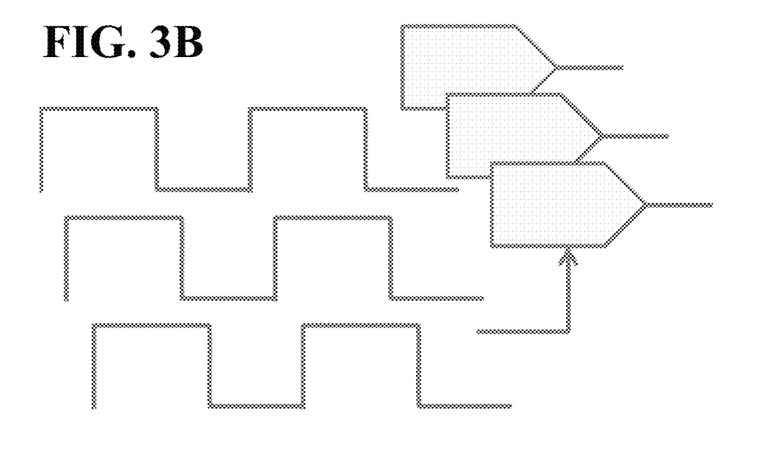

In another embodiment, the second converter 140 may include a plurality of analog-to-digital converters that are activated in a sequence to sequentially sample the output signal within a sampling period of the second frequency. FIG. 3B illustrates exemplary sampling signals that may be used for the second converter 140. In this case, multiple analog-to-digital converters included in the second converter 140 may be connected in parallel to each other, each sampling the output signal at a different time within a sampling period. The resulting feedback signals may be combined. Separate sampling signals may be used for each individual analog-to-digital converter, with the sampling signals having timing offset from each other, allowing each individual analog-to-digital converter to sample the output signal at a different time, for example at multiple offset rising edges or falling edges of the sampling signals. Alternatively, the multiple analog-to-digital converters may be share the same sampling signal, but may trigger each other in a cascading fashion.

Figure 3C:
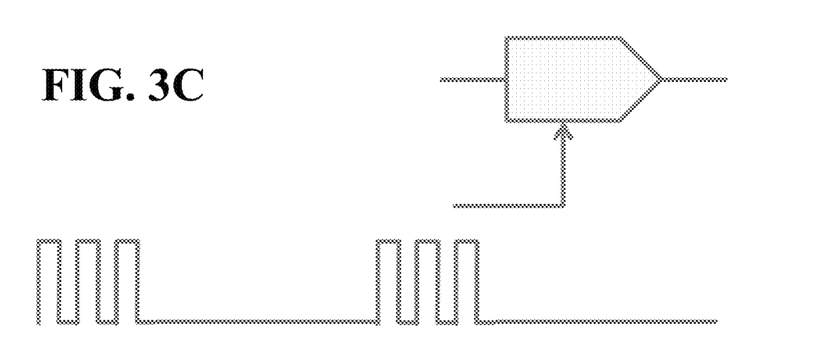

In a further embodiment, the second converter 140 may include an analog-to-digital converter that samples the output signal at more than one time within each sampling period of the second frequency. FIG. 3C illustrates exemplary sampling signals that may be used for the second converter 140. In this case, a single analog-to-digital converter in the second converter 140 may sample the output signal multiple times within each sampling period of the sampling signal, for example at the rising edges or the falling edges of the sampling signal. Here, there sampling signal may contain multiple sub-sampling pulses within each sampling period, thus allowing the second converter 140 to sample the output signal multiple times in each sampling period.

With such undersampling techniques illustrated in FIGS. 3A-3C, the second converter 140 may reduce the number of samples over time, and thus reduce power requirements. The undersampling techniques illustrated in FIGS. 3B and 3C may effectively achieve multiple sampling while performing undersampling at the same time. That is, their overall sampling rating is fewer than the frequencies of the distortion signals, but they may offer additional number of samples than in FIG. 3A, at the expense of additional power consumption. The additional sampling done in FIGS. 3B and 3C may provide additional information for the predistorter to increase compensation for the memory effect in the power amplifier 150.

Furthermore, the technique illustrated in FIG. 3B may require additional hardware components in the multiple analog-to-digital converters in the second converter 140, while in FIG. 3C, only a single analog-to-digital converter may be needed. Additionally, a combination of the techniques described may be used to achieve the undersampling in the second converter 140, and the sampling frequency and the sampling signal may be adjusted as needed in real time to fit performance requirements of the PA.

Figure 4:
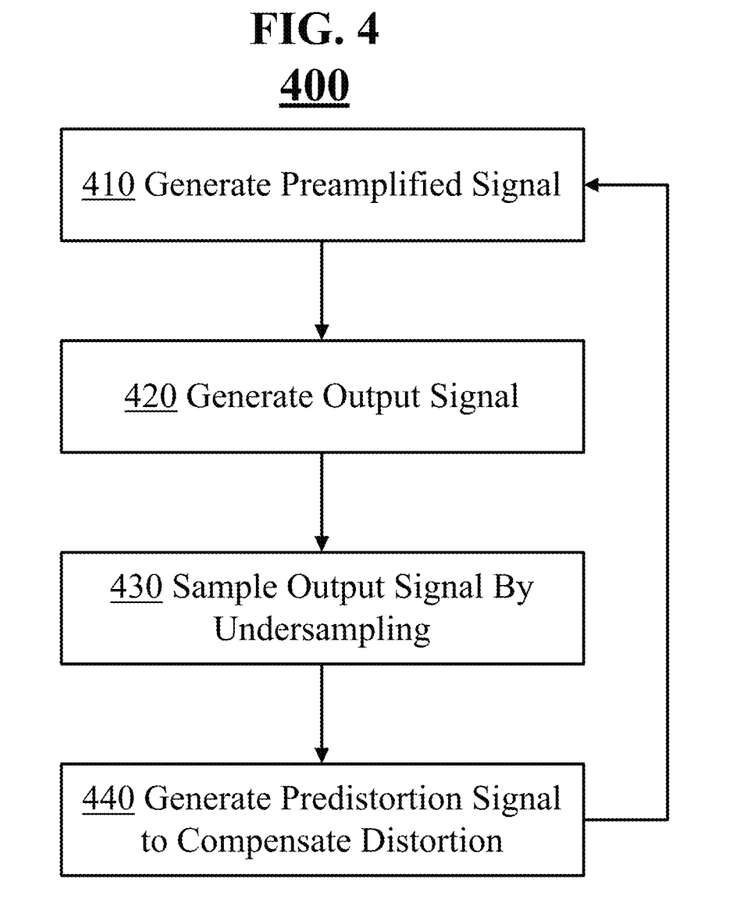
FIG. 4 illustrates an exemplary method according to an embodiment of the present disclosure.

FIG. 4 illustrates an exemplary method 400 for compensating distortions in a power amplifier. The method may include generating, by a first converter 130, a preamplified signal based on a predistortion signal at block 410. At block 420, a power amplifier 150 generates an output signal based on the preamplified signal and the input signal. At block 430, a second converter 140 samples the output signal by undersampling to generate a feedback signal. At block 440, a predistorter 110 generates a predistortion signal based on an input signal.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

I claim:

1. An amplifier system, comprising:
   a predistorter receiving an input signal to be transmitted by the system;
   a first converter receiving an output of the predistorter to generate a preamplified signal, wherein the first converter samples the output of the predistorter using a first timing signal;
   a subtractor receiving an output of a filter of the predistorter, wherein the filter receives the input signal;
   a power amplifier receiving the preamplified signal to generate an output signal based on the preamplified signal, wherein the output signal includes a distortion signal at a first frequency; and
   a second converter configured to sample the distortion signal using a second timing signal with a second frequency that is of a lower frequency than the first frequency, wherein the first timing signal is also at the second frequency; wherein the predistorter is configured to generate:
      a model feedback signal including the distortion signal at the first frequency based on the sampled distortion signal; and
      a predistorted input signal as a function of the received input signal and the model feedback signal.

2. The amplifier system according to claim 1, wherein the first converter generates the preamplified signal based on the second timing signal of the second converter.

3. The amplifier system according to claim 1, wherein the second frequency is greater than a frequency of the predistorted input signal.

4. The amplifier system according to claim 1, wherein the first converter comprises a digital-to-analog converter.

5. The amplifier system according to claim 3, wherein the second converter comprises an analog-to-digital converter that samples the distortion signal at more than one time within each sampling period of the second frequency.

6. The amplifier system according to claim 3, wherein the second converter comprises a plurality of analog-to-digital converters that are activated in a sequence to sequentially sample the distortion signal within a sampling period of the second frequency.

7. The amplifier system according to claim 1, wherein the predistorter comprises the filter and a controller that adjusts the filter to transform the input signal to generate the predistorted input signal.

8. A method, comprising:
   generating, by a first converter, a preamplified signal based on a predistorted input signal, wherein the first converter samples an output of a predistorter using a first timing signal;
   generating, by a power amplifier, an output signal based on the preamplified signal, wherein the output signal includes a distortion signal at a first frequency; and
   sampling, by a second converter, the distortion signal using a second timing signal with a second frequency that is of a lower frequency than the first frequency, wherein the first time signal is also at the second frequency;
   generating, with the predistorter, a model feedback signal including the distortion signal at the first frequency based on the sampled distortion signal;
   receiving, with a subtractor, an output of a filter of the predistorter, wherein the filter receives the input signal; and
   generating, with the predistorter, an updated predistorted input signal as a function of a received input signal and the model feedback signal.

9. The method according to claim 8, wherein the first converter generates the preamplified signal based on the second timing signal of the second converter.

10. The method according to claim 8, wherein the second frequency is greater than a frequency of the predistorted input signal.

11. The method according to claim 8, wherein the first converter comprises a digital-to-analog converter.

12. The method according to claim 10, wherein the second converter comprises an analog-to-digital converter that samples the distortion signal at more than one time within each sampling period of the second frequency.

13. The method according to claim 10, wherein the second converter comprises a plurality of analog-to-digital converters that are activated in a sequence to sequentially sample the distortion signal within a sampling period of the second frequency.

14. The method according to claim 8, wherein the predistorter comprises the filter and a controller that adjusts the filter to transform the input signal to generate the updated predistorted input signal.

15. A non-transitory computer-readable medium, executable by a processor to perform:
   generating, by a first converter, a preamplified signal based on a predistorted input signal, wherein the first converter samples an output of a predistorter using a first timing signal;

generating, by a power amplifier, an output signal based on the preamplified signal, wherein the output signal includes a distortion signal at a first frequency; and sampling, by a second converter, the distortion signal using a second timing signal with a second frequency that is of a lower frequency than the first frequency, wherein the first timing signal is also at the second frequency;

generating, with the predistorter, a model feedback signal including the distortion signal at the first frequency based on the sampled distortion signal;

receiving, with a subtractor, an output of a filter of the predistorter, wherein the filter receives the input signal; and generating, with the predistorter, an updated predistorted input signal as a function of a received input signal and the model feedback signal.

16. The non-transitory computer-readable medium according to claim 15, wherein the first converter generates the preamplified signal based on the second timing signal of the second converter.

17. The non-transitory computer-readable medium according to claim 15, wherein the second frequency is greater than a frequency of the predistorted input signal.

18. The non-transitory computer-readable medium according to claim 15, wherein the first converter comprises a digital-to-analog converter.

19. The non-transitory computer-readable medium according to claim 17, wherein the second converter comprises an analog-to-digital converter that samples the distortion signal at more than one time within each sampling period of the second frequency.

20. The non-transitory computer-readable medium according to claim 17, wherein the second converter comprises a plurality of analog-to-digital converters that are activated in a sequence to sequentially sample the distortion signal within a sampling period of the second frequency.

* * * * *